United States Patent [19]

Mudra

[11] Patent Number: 4,592,606
[45] Date of Patent: Jun. 3, 1986

[54] BREAKAWAY JUMPER EDGE CONNECTOR

[75] Inventor: Robert E. Mudra, Glenview, Ill.

[73] Assignee: Zenith Electronics Corporation, Glenview, Ill.

[21] Appl. No.: 652,935

[22] Filed: Sep. 20, 1984

[51] Int. Cl.$^4$ .............................................. H01R 29/00
[52] U.S. Cl. .................................... 339/31 R; 339/17 T
[58] Field of Search ................ 339/14 R, 17 C, 17 T, 339/17 R, 17 A, 31 R, 31 M, 19, 18, 222

[56] References Cited

U.S. PATENT DOCUMENTS

| | | | |
|---|---|---|---|
| 2,498,493 | 2/1950 | Hickernell | 339/17 T |
| 3,307,051 | 2/1967 | Parsons | 339/31 R |
| 4,157,785 | 6/1979 | Freliech | 339/31 R |

Primary Examiner—Gil Weidenfeld
Assistant Examiner—Paula A. Austin

[57] ABSTRACT

A printed circuit board is provided with a pair of parallel foil conductive strips on one side thereof coupled by means of a conductive foil jumper adjacent and generally parallel to an edge of the circuit board. In this configuration, the two conductive strips are coupled in circuit by means of the foil jumper. An inner portion of the circuit board is provided with an aperture positioned interiorly on the circuit board relative to the foil jumper and adjacent thereto. The portion of the circuit located between the parallel foil conductive strips and between the aperture and the edge of the circuit board and upon which the foil jumper is positioned is detached from the circuit board electrically decoupling the parallel foil conductive strips. With the foil jumper thus removed, a connector may then be positioned on the edge of the circuit board in contact with the foil conductors for coupling an associated electronic device in circuit therebetween for processing of the signal carried by the foil conductors. The aperture includes a first pair of spaced stress concentrators directed toward the edge of the circuit board. A second pair of spaced stress concentrators aligned with the first pair in the form of slots are provided on a second side of the foil jumper on the edge of the circuit board to facilitate the breaking away and removal of that portion of the circuit board between the foil conductive strips and upon which the foil jumper is positioned.

18 Claims, 5 Drawing Figures

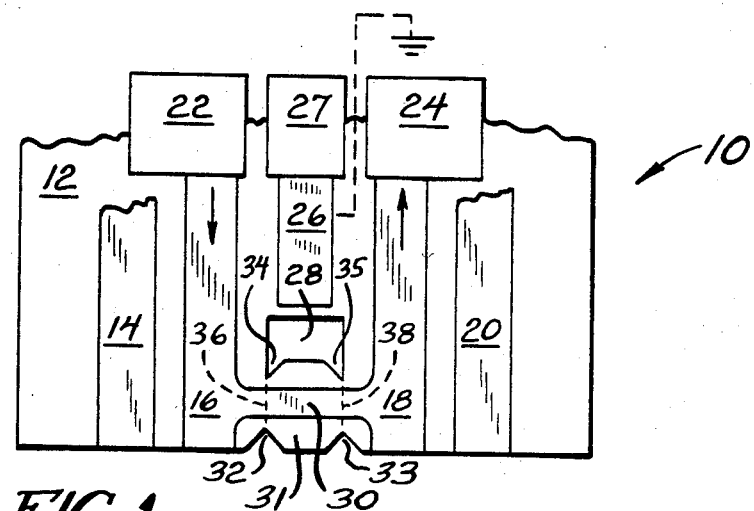
FIG. 1
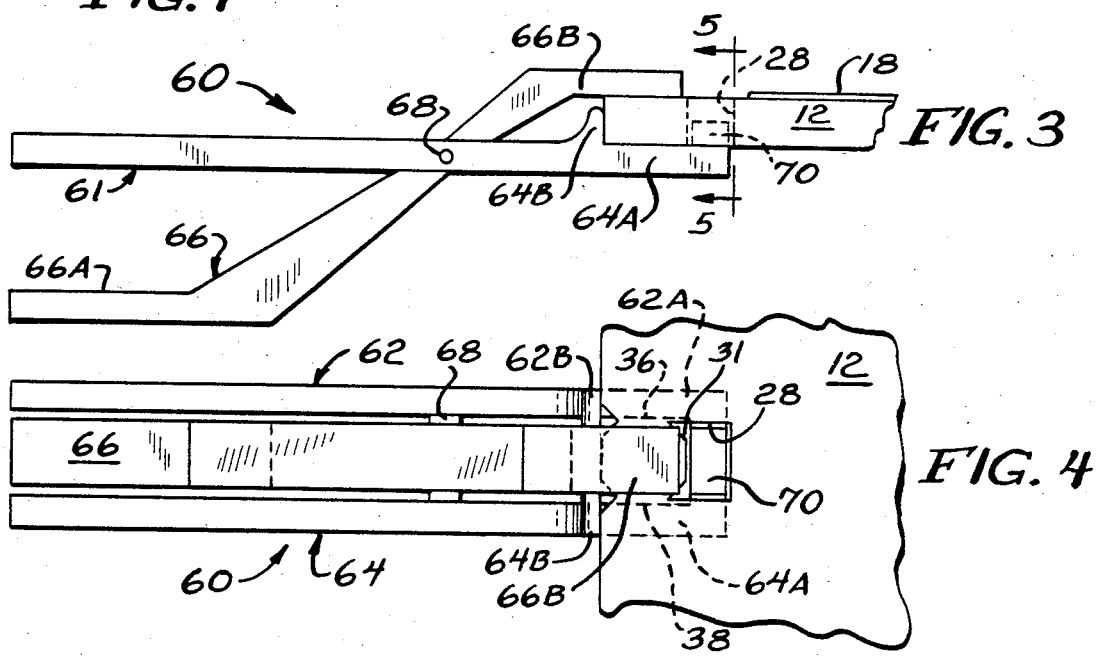
FIG. 3
FIG. 4
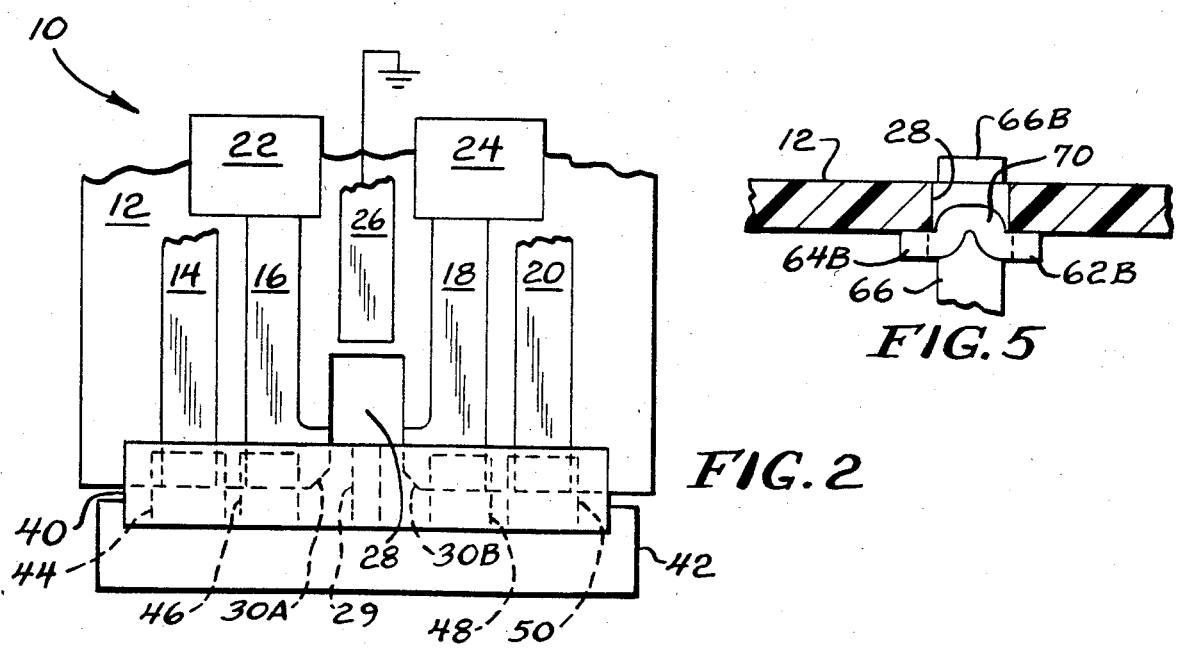
FIG. 2
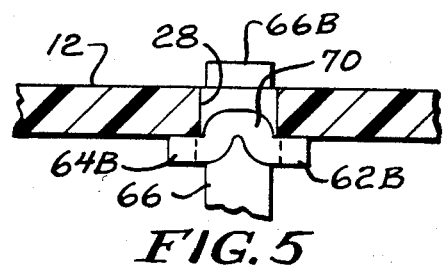
FIG. 5

BREAKAWAY JUMPER EDGE CONNECTOR

BACKGROUND OF THE INVENTION

This invention relates generally to printed circuit board conductors and connections and is more specifically directed to a dual mode breakaway edge connector arrangement for a printed circuit board.

Printed circuit boards typically include a plurality of foil conductors on either one or both surfaces thereof, some of which conductors extend to the edge of the board. A multi-contact connector is generally positioned upon an edge of the circuit board and in electrical contact with the various foil conductors for either providing an input signal to the circuit board or receiving an output signal therefrom. Sometimes it is desirable to couple various foil conductors in more than one circuit arrangement. For example, in one mode of operation two circuit board conductors may be directly coupled in circuit. In another mode of operation, it may be necessary to connect an accessory device between these two conductors. The accessory device may either provide an output signal representing the signal carried by these conductors from the circuit board, or it may process this signal and provide the thus processed signal back into the circuit board.

In order to provide this dual configuration and function capability, a "dummy" connector is typically connected to the circuit board foil conductors adjacent the edge of the circuit board. This connector includes a jumper for connecting the two conductors in the first mode of operation and is removed altogether from the circuit board in the second mode of operation to permit an accessory to be attached to the edge of the circuit board and the foil conductors thereon.

This arrangement has several drawbacks. For example, the electronic device is generally sold with the dummy connector even when the accessory involved is optional and may never be connected to the device's circuit board. This, of course, adds unnecessary complexity and cost to the device particularly in the case of modular systems which are inherently designed for the selective configuration of various accessories and may require a large number of dummy connectors. The trend toward modular systems, which has played an important role in the design and development of audio entertainment centers, is now gaining increasing acceptance in other electronic systems such as television receivers and computerized video display terminals. The modular approach permits the user to design the system to his or her unique requirements and application.

In addition to increasing the unit cost of the electronic device, these dummy connectors are also subject to corrosion particularly in hostile environments. Connector corrosion may not only result in a malfunction in and the failure of the electronic device, but may also render the installation of an optional accessory impossible and necessitate replacement of the circuit board. Moreover, this type of connector is highly susceptible to incorrect installation either at the time of manufacture by an assembler or when the system within which the device is used is reconfigured by a user. In either case, improper installation of the dummy connector may result in the failure of and damage to not only the device in which the connector is installed, but also to other electronic apparatus within the system.

The present invention is intended to overcome the aforementioned limitations of the prior art by providing a breakaway jumper edge connector for use in either mutually coupling a pair of foil conductors on a circuit board or for inserting additional circuitry therebetween by coupling the circuitry to the conductors along the edge of the printed circuit board. The present invention does away with the requirement for a dummy edge connector for a variably configured circuit board which may be easily coupled to or decoupled from additional circuitry as desired.

OBJECTS OF THE INVENTION

Accordingly, it is an object of the present invention to provide a dual connection arrangement for the edge of a printed circuit board.

It is another object of the present invention to facilitate the coupling of a signal out of and back into a circuit board by means of a breakaway jumper edge connector.

Yet another object of the present invention is to provide an inexpensive, easily converted, dual mode electrical coupling arrangement for use adjacent the edge of a circuit board wherein only the circuit board carries the signal in a first mode of operation and wherein the signal is looped out of and back into the circuit board in a second mode of operation.

A further object of the present invention is to eliminate the requirement for a dummy connector in a variably configured printed circuit board edge connection.

A still further object of the present invention is to facilitate the coupling of electronic apparatus to the edge of a printed circuit board.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a top plan view of a printed circuit board having a breakaway jumper edge connector in accordance with the present invention;

FIG. 2 is a top plan view of the printed circuit board with a breakaway jumper edge connector as shown in FIG. 1 wherein the jumper edge connector has been removed and a multi-contact connector is coupled to the edge of the printed circuit board;

FIG. 3 is a lateral view of apparatus for removing the jumper edge connector from the printed circuit board shown in FIG. 1;

FIG. 4 is a top plan view of the apparatus for removing the jumper edge connector from the printed circuit board shown in FIG. 3; and FIG. 5 is a sectional view of the apparatus for removing the jumper edge connector from the printed circuit board of FIG. 3 taken along sight line 5—5 therein.

DETAILED DESCRIPTION OF THE PREFERRED EMBODIMENT

Referring to FIG. 1, there is shown a top plan view of a breakaway jumper edge connector arrangement 10 in accordance with the present invention.

The breakaway jumper edge connector arrangement 10 is adapted for use with a circuit board, or substrate, 12 on which are positioned first, second, third, and fourth foil conductors 14, 16, 18 and 20. The circuit board 12 has a generally flat, rectangular shape and is used primarily for mechanical support and insulating purposes and is typically comprised of a ceramic, plastic or glass substrate material. The foil conductors are generally in the form of strips on one or both surfaces of the circuit board 12 and are typically comprised of a conductive metal. Conductors on respective surfaces of the circuit board 12 may be electrically coupled by conductors which pass through apertures within the intermediate substrate. Thus, while the breakaway jumper edge connector arrangement 10 of the present invention is described herein for use with foil conductors on only one side of the circuit board 12, it is also compatible with a circuit board arrangement having a plurality of foil conductors on each side thereof.

As shown in FIG. 1, each of the foil conductors 14, 16, 18 and 20 extends generally to the edge of the circuit board 12. The second foil conductor 16 is coupled to a signal source 22 which may be any conventional circuitry for providing a signal to the second foil conductor 16 for transmission thereon. Similarly, the third foil conductor 18 is coupled to a signal receiver 24 which may be any conventional circuitry for receiving a signal transmitted by the third foil conductor 18. The second and third foil conductors 16, 18, are further mutually coupled by means of a jumper conductor 30. Thus, a signal provided to the second foil conductor 16 from the signal source 22 is provided to the third foil conductor 18 via the jumper conductor 30 and thence to the signal receiver 24. The terms "signal source" and "signal receiver" are used merely to indicate the direction of signal flow in the combination of the second and third foil conductors 16, 18 and the jumper conductor 30 as shown by the arrows in FIG. 1 and, as previously stated, may be comprised of conventional circuitry and components. In addition, while the signal is described as flowing in a given direction within the combination of the several conductors, the present invention will operate equally well with a signal flowing in either the opposite direction or with signals alternately flowing in opposite directions within the aforementioned conductor combination. The first and fourth foil conductors 14, 20 may similarly be coupled to appropriate circuitry as well as circuit board edge connectors (not shown) for providing signals into and out of the circuit board 12. Thus, the first and fourth foil conductors 14, 20 are not a part of the present invention and are shown in order to more completely describe the environment for which the present invention is intended for use.

Positioned intermediate the second and third foil conductors 16, 18 and in an inner portion of the circuit board 12 relative to the jumper conductor 30 is an aperture 28. The aperture 28 extends through the circuit board 12 such that a knock-out portion 31 of the circuit board is defined between the aperture 28 and the edge of the circuit board 12. The knock-out portion 31 of the circuit board 12 is similarly positioned intermediate the second and third foil conductors 16, 18 and provides support for the jumper conductor 30 which is positioned upon and extends across the knock-out portion 31. While the aperture 28 is shown generally rectangular in shape, it is not limited to this configuration and may assume virtually any shape including that of a circle. Also positioned between the second and third foil conductors 16, 18 is a fifth foil conductor 26 which may be either coupled to other circuitry 27 (shown as a block in FIG. 1 for simplicity) on the circuit board 12 or to neutral ground potential as shown in dotted line form in FIG. 1. With the fifth foil conductor 26 coupled to neutral ground potential, it provides isolation between the second and third foil conductors 16, 18 and shielding for signals carried by these conductors. The circuitry 27 on the circuit board 12 may be of virtually any type or configuration as the present invention is not limited to operation with specific circuitry or components. In addition, while only a single conductor, i.e., foil conductor 26, is shown positioned between the second and third foil conductors 16, 18, the present invention is not limited to this or any other specific number of conductors positioned intermediate the two foil conductors electrically coupled by means of the jumper conductor 30. Increasing the number of foil conductors intermediate the second and third foil conductors merely requires a corresponding increase in the length of the jumper conductor 30. On the other hand, it is not an essential feature of the present invention that any conductive strip be positioned intermediate the electrically coupled second and third foil conductors 16, 18.

Positioned on the edge of the circuit board 12 intermediate the second and third foil conductors 16, 18 in a preferred embodiment of the present invention are first and second stress concentrators 32, 33 in the form of slots, or indentations, therein. In addition, respective corner portions of the aperture 28 in the circuit board 12 are provided with corresponding third and fourth stress concentrators 34, 35 which extend toward the edge of the circuit board 12. While not necessary for implementation of the present invention, the various stress concentrators incorporated in the circuit board 12 tend to increase the reliability and repeatability of removing the knock-out portion 31 of the circuit board adjacent to the aperture 28 as described immediately below. Lines of force shown as dotted lines 36 and 38 in FIG. 1 respectively extend between the first and third stress concentrators 32, 34 as well as between the second and fourth stress concentrators 33, 35. It can be seen from FIG. 1 that the width of the knock-out portion 31 of the circuit board 12 is reduced between the immediately adjacent, facing stress concentrators 32, 34 and 33, 35 such that displacement of the knock-out portion 31 will tend to cause its separation from the circuit board 12 along the first and second stress lines 36, 38. An example of apparatus for engaging the knock-out portion 31 of the circuit board 12 and effecting its removal therefrom is shown in FIGS. 3, 4 and 5 and is described in detail below. However, a number of devices and procedures for removing the knock-out portion 31 of the circuit board 12 could be designed and implemented by those skilled in the art and the present invention is intended to include these various embodiments and is not limited to the apparatus shown in FIGS. 3, 4 and 5.

Referring to FIG. 2, there is shown a top plan view of the breakaway jumper edge connector arrangement 10 of FIG. 1 wherein the knock-out portion 31 of the circuit board 12 has been removed therefrom along the first and second stress lines 36, 38 in accordance with the present invention. With the knock-out portion 31 removed from the circuit board 12, the second and third foil conductors 16, 18 are no longer coupled by means of the jumper conductor 30 and the aperture 28 extends to the edge of the circuit board 12. A multi-contact connector 40 is shown in FIG. 2 positioned on the edge of the circuit board 12 for coupling an accessory 42 thereto. The connector 40 includes first, second, third and fourth contacts 44, 46, 48 and 50, shown in dotted line form in FIG. 2, which respectively engage so as to establish electrical contact with the first, second, third and fourth foil conductors 14, 16, 18 and 20. The contacts within the connector 40 may be conventional such as of the resilient, snap-acting type for securely engaging a respective foil conductor on the circuit board 12. The connector 40 includes a nonconducting housing typically comprised of a plastic material, while the several contacts therein are comprised of a conductive metal. The accessory 42 is shown merely as a block in FIG. 2 and may be any conventional device or circuit arrangement for receiving a signal from the signal source 22 via the second foil conductor 16, processing the signal as desired, and providing the thus processed signal to the signal receiver 24 via the third foil conductor 18.

Referring to FIGS. 3 and 4, there are respectively shown lateral and top plan views of a circuit board edge breakaway device 60 for use with the breakaway jumper edge connector arrangement 10 of the present invention. The edge breakaway device 60 includes a first pivoting arm 61 and a second pivoting arm 66. The first and second pivoting arms 61, 66 are pivotally connected by means of a coupling pin 68 which extends therethrough and provides for the relative rotational displacement between the first and second pivoting arms 61, 66. As shown in FIG. 4, the second pivoting arm 66 includes left and right members 62, 64 which are coupled adjacent the end of the edge breakaway device 60 which engages the circuit board 12 as described below. The third foil conductor 18 previously discussed with respect to FIGS. 1 and 2 is shown on the upper surface of the circuit board 12 in FIG. 3, but has been omitted from FIG. 4 for simplicity.

The second pivoting arm 66 includes a handle portion 66A on a first end thereof and an engaging portion 66B on a second end thereof. The handle portion 66A of the second pivoting arm 66 and the adjacent portions of the first pivoting arm 61 are adapted for grasping by a user whereby the relative rotational displacement between the first and second pivoting arms 61, 66 may be effected for grasping and removing the knock-out portion 31 of the circuit board 12 therefrom.

The second end of the first pivoting arm 61 includes an alignment insert 70 positioned between respective adjacent ends of the left and right members 62, 64. The alignment insert 70 is adapted for insertion within the aperture 28 of the circuit board 12. In addition, the left and right members 62, 64 are provided with respective engaging portions 62B, 64B for engaging the edge of the circuit board 12 in an abutting manner in order to ensure proper positioning of the alignment insert 70 relative to the aperture 28 to permit its insertion therein. With the alignment insert 70 positioned within the aperture 28 and each of the engaging portions 62B, 64B of the respective left and right members 62, 64 engaging the edge of the circuit board 12, the engaging portion 66B of the second pivoting arm 66 is positioned immediately above the knock-out portion 31 of the circuit board 12. Similarly, with the alignment insert 70 positioned within the aperture 28 and each of the engaging portions 62B, 64B in abutting contact with the edge of the circuit board, the support portions 62A, 64A of the left and right members 62, 64 are positioned in contact with the lower surface of the circuit board on opposite sides of the aperture 28 and the knock-out portion 31 thereof. This arrangement can be more clearly seen in FIG. 5, which is a sectional view of the circuit board edge breakaway device 60 of FIG. 3 taken along sight line 5—5 therein.

With the engaging portion 66B of the second pivoting arm 66 positioned immediately above the knock-out portion 31 of the circuit board 12 and with the respective support portions 62A and 64A of the left and right members 62, 64 positioned on respective sides of the knock-out portion 31 and in abutting contact with the lower surface of the circuit board 12, displacement of the adjacent end portions of the first and second pivoting arms 61, 66 will result in engagement of the engaging portion 66B of the second pivoting arm 66 with the knock-out portion 31. Further displacement of the first and second pivoting arms 61, 66 toward each other will result in the displacement of the knock-out portion 31 and its detachment from the circuit board 12 along the first and second stress lines 36, 38 shown in dotted line form in FIG. 4. The support portions 62A, 64A of the left and right members 62, 64 support and stabilize the circuit board 12 during the removal of the knock-out portion 31 thereof. Detachment of the knock-out portion 31 from the circuit board 12 along these stress lines is facilitated by means of the various stress concentrators previously described with respect to FIG. 1. The circuit board edge breakaway device 60 therefore permits the knock-out portion 31 to be removed from the circuit board 12 along the first and second stress lines 36, 38 to permit the breakaway jumper edge connector arrangement 10 of the present invention to assume the configuration of FIG. 2 wherein the second and third foil conductors 16, 18 are coupled by means of the combination of a connector 40 and an accessory 42.

Another advantage of the dual mode breakaway jumper edge connector arrangement of the present invention is that it provides circuit board edge connector keying which requires the circuitry on the circuit board to be reconfigured before an edge connector adapted for coupling to that electrical configuration can be inserted on the edge of the circuit board. In other words, referring to FIGS. 1 and 2, before the connector 40 can be attached to the edge of the circuit board 12, the knock-out portion 31 of the circuit board must be removed therefrom. Insertion of the connector 40 onto the edge of the circuit board 12 is precluded by the keying portion 29 (shown in dotted line form in FIG. 2) of the connector 40. The keying portion 29 of the connector 40 is positioned in an open, forward portion of the connector. The keying portion 29 may either be provided for in the fabrication of the connector such as in the mold used for forming the connector or may be inserted in the connector following its fabrication. An attempt to insert the connector 40 onto the edge of the circuit board 12 with the circuit board's knock-out portion 31 in place will place the keying portion 29 in abutting contact with the circuit board's edge and prevent the insertion of the connector thereon. With the knock-out portion 31 of the circuit board 12 removed, the keying portion 29 of the connector 40 will be positioned within the gap in the circuit board's edge thus formed permitting the connector to be positioned on the circuit board's edge. This arrangement prevents a connector adapted for electrical coupling to a particular circuit configuration on the circuit board from being inserted on the circuit board until it is arranged in that particular circuit configuration.

There has thus been shown a dual mode breakaway jumper edge connector arrangement for either directly coupling a pair of foil conductors on a substrate in circuit or for coupling the two conductors by means of the combination of a circuit board edge connector and accessory coupled thereto wherein the signal on the circuit board is "looped-out" of the circuit board, processed, and returned to the circuit board. The arrangement includes a jumper conductor coupling the foil conductors adjacent the edge of the circuit board and positioned on the knock-out portion thereof which is adapted for easy removal from the circuit board for arrangement in the second mode of operation. Means are disclosed for manually severing and removing the foil jumper portion of the circuit board.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim;

1. A breakaway jumper edge connector arrangement for use in a first or second mode of operation on a printed circuit board, said arrangement comprising:
    first and second spaced conductors positioned on the circuit board adjacent to an edge thereof and adapted to receive an edge connector for providing electrical coupling therebetween;
    an aperture in the circuit board located intermediate said first and second conductors,
    a breakaway section of the circuit board located intermediate said first and second conductors and said aperture and said edge of the circuit board and adapted for easy removal therefrom;
    a third conductor positioned on said breakaway section of the circuit board and electrically coupling the first and second conductors in said first mode of operation, wherein the first and second conductors may be electrically coupled by means of said edge connector with said breakaway section and said third conductor thereon removed from the circuit board in the second mode of operation; and
    first stress concentrators positioned on said edge of the circuit board for directing a force applied to the circuit board in removing said breakaway section therefrom toward said aperture in facilitating the removal of said breakaway section.

2. A breakaway jumper edge connector arrangement in accordance with claim 1 wherein said first, second and third conductors are in the form of metal foil strips on a surface of the circuit boards.

3. A breakaway jumper edge connector arrangement in accordance with claim 1 further comprising second stress concentrators positioned in said aperture for directing said force toward said first stress concentrators on the edge of the circuit board facilitating the removal of said breakaway section.

4. A breakaway jumper edge connector arrangement in accordance with claim 1 wherein said first and second conductors are respectively coupled to signal source and signal receiver circuitry and said edge connector is coupled to signal processing means for processing a signal output from said signal source and providing the thus processed signal to said signal receiver circuitry.

5. A breakaway jumper edge connector arrangement in accordance with claim 1 further comprising a fourth conductor coupled to neutral ground potential and positioned intermediate said first and second conductors for providing shielding therebetween.

6. A breakaway jumper edge connector arrangement in accordance with claim 5 wherein said fourth conductor is in the form of a metal foil strip.

7. A breakaway jumper edge connector arrangement in accordance with claim 1 further comprising a fourth conductor coupled to electronic circuitry and positioned intermediate said first and second conductors.

8. A breakaway jumper edge connector arrangement in accordance with claim 7 wherein said fourth conductor is in the form of a metal foil strip.

9. In a circuit board having an aperture therein and including first and second conductors thereon, means for directly coupling said conductors in a first mode operation or for coupling said conductors by means of intermediate circuitry in a second mode of operation, said means comprising:
    a breakaway portion of the circuit board adjacent an edge thereof;
    a third conductor positioned on said breakaway portion of the circuit board coupling the first and second conductors in circuit in the first mode of operation;
    means for engaging and removing said breakaway portion from the circuit board, said engaging and removing means adapted for insertion in the circuit board aperture for ensuring proper alignment between said engaging and removing means and said breakaway portion, wherein said engaging and removing means includes edge alignment means thereon for engaging the edge of the circuit board in ensuring proper positioning of said engaging and removing means relative to said breakaway portion; and
    edge connector means for coupling the intermediate circuitry in circuit between the first and second conductors in the second mode of operation, a stress concentrator means positioned in said aperture and on the edge of the circuit board adjacent said aperture for ensuring separation of said breakaway portion from the circuit board along predetermined lines.

10. Coupling means as in claim 9 further comprising a fourth conductor coupled to neutral ground potential and positioned on the circuit board intermediate said first and second conductors for providing shielding therebetween.

11. Coupling means as in claim 9 wherein said engaging and removing means includes first and second pivoting arms for respectively engaging the circuit board and said breakaway portion in effecting relative displacement therebetween.

12. Coupling means as in claim 11 wherein said engaging and removing means further includes a handle to permit manual operation thereof by a user.

13. In the combination of a circuit board having a plurality of foil conductors thereon defining a first circuit configuration and a connector adapted for electrical coupling to said foil conductors along an edge of said circuit with said foil conductors in a second circuit configuration, an arrangement for preventing coupling of said connector to said foil conductors while in said first circuit configuration and for converting said foil conductors from said first circuit configuration to said second circuit configuration, said arrangement comprising:

- an aperture in the circuit board positioned adjacent the edge thereof so as to define a knock-out portion of said circuit board between said aperture and said edge, wherein said knock-out portion of said circuit board is adapted for easy removal therefrom;
- a first foil conductor coupled to a second and a third foil conductor on said circuit board in said first circuit configuration, said first foil conductor positioned on said knock-out portion of said circuit board and wherein said second and third foil conductors are electrically decoupled in said second circuit configuration with said knock-out portion removed from said circuit board;
- first and second contacts in said connector adapted for engaging said second and third foil conductors, respectively, in said second circuit configuration; and
- a keying element positioned in said connector so as to abut said knock-out portion of the circuit board preventing coupling of said connector to said foil conductors in the first circuit configuration and wherein said keying element is adapted for insertion in a gap formed in the circuit board upon the removal of the knock-out portion therefrom, whereupon said first and second contacts engage said second and third foil conductors in said second circuit configuration.

14. An arrangement as in claim 13 wherein said keying element comprises a fixed structure in said connector positioned intermediate said first and second contacts and extending from an upper portion to a lower portion of said connector.

15. An arrangement as in claim 13 further comprising stress concentrators in said circuit board positioned adjacent the edge thereof and adjacent said aperture to facilitate the removal of said knock-out portion of the circuit board.

16. An arrangement as in claim 13 wherein said connector is coupled to signal processing circuitry.

17. An arrangement as in claim 13 further comprising a fourth foil conductor positioned on the circuit board intermediate said second and third foil conductors.

18. An arrangement as in claim 17 wherein said fourth foil conductor is coupled to neutral ground potential for electrically isolating said second and third foil conductors.

* * * * *